United States Patent [19]

Miura et al.

[11] Patent Number: 5,768,108

[45] Date of Patent: Jun. 16, 1998

[54] MULTI-LAYER WIRING STRUCTURE

[75] Inventors: Osamu Miura, Ibaraki-ken; Kunio Miyazaki, Hitachi; Akio Takahashi, Hitachiota; Motoyo Wajima, Isehara; Ryuji Watanabe, Ibaraki; Takao Miwa, Katsuta; Yuichi Satsu, Hitachi; Shigeo Amagi, Ibaraki-ken, all of Japan

[73] Assignee: Hitachi, Ltd., Tokyo, Japan

[21] Appl. No.: 720,028

[22] Filed: Sep. 27, 1996

Related U.S. Application Data

[63] Continuation of Ser. No. 207,702, Mar. 9, 1994, abandoned.

[30] Foreign Application Priority Data

Mar. 11, 1993 [JP] Japan ................... 5-050373

[51] Int. Cl.$^6$ ................ H05K 1/11; H05K 1/09; H05K 1/00; H05K 1/16
[52] U.S. Cl. ................ 361/792; 361/795; 174/256; 174/257; 174/258; 174/260; 174/262; 174/264
[58] Field of Search ................ 174/260–264, 174/266, 250, 256–259; 361/792–795, 748, 784–785, 788, 790

[56] References Cited

U.S. PATENT DOCUMENTS

| | | |
|---|---|---|
| 4,299,873 | 11/1981 | Ogihara et al. |
| 4,675,789 | 6/1987 | Kuwabara et al. |
| 4,710,854 | 12/1987 | Yamada et al. |
| 4,777,060 | 10/1988 | Mayr et al. ................ 427/34 |
| 4,803,450 | 2/1989 | Burgess et al. ................ 361/792 |
| 4,854,038 | 8/1989 | Wiley ................ 29/830 |
| 4,868,350 | 9/1989 | Hoffarth et al. ................ 29/830 |
| 4,997,698 | 3/1991 | Oboodi et al. ................ 428/209 |
| 5,229,550 | 7/1993 | Bindra et al. ................ 174/262 |
| 5,281,151 | 1/1994 | Arima et al. ................ 439/68 |
| 5,483,421 | 1/1996 | Gedney et al. ................ 361/771 |
| 5,583,321 | 12/1996 | DiStefano et al. ................ 174/264 |

Primary Examiner—Bot L. Ledynh
Attorney, Agent, or Firm—Antonelli, Terry, Stout, & Kraus, LLP

[57] ABSTRACT

A multi-layer wiring structure for mounting electronic devices is provided to be used in an electronic computer, a work station or the like, and more particularly a multi-layer packaging board having microscopic wiring layers, which board has an excellent dimensional stability and a high reliability, and also a method of producing such a board are provided. The multi-layer wiring structure includes a complex of at least two sub-assemblies each having wiring layers formed respectively on opposite sides of a core material of a low thermal expansive metal through an insulation layer in such a manner that the wiring layers correspond in area ratio to each other. The sub-assemblies are connected to one another by conductors via through holes. In this structure, the wiring structure having the core material of a low thermal expansive metal is used as a base, and therefore a dimensional change of a board is small, and microscopic wiring layers can be formed, and the reliability of connection between the sub-assemblies is enhanced. Furthermore, the board can be produced at low costs.

16 Claims, 10 Drawing Sheets

MULTI-LAYER WIRING STRUCTURE

This application is a Continuation application of application Ser. No. 08/207,702, filed Mar. 9, 1994, now abandoned.

BACKGROUND OF THE INVENTION

This invention relates generally to a multi-layer wiring structure for mounting electronic parts used in an electronic computer, a work station or the like, and more particularly to a packaging board having many wiring layers and also to a method of producing such a packaging board.

DESCRIPTION OF THE RELATED ART

In order to transfer signals between LSIs at high speed in a packaging board used for an electronic computer or the like, it has become important problems to package a plurality of LSIs on the packaging board at a high density, and also to reduce the delay of transfer of the signal in the board.

To resolve such problems, there has been proposed a thin film-thick film mixed board in which wiring layers of W or Mo are formed by a thick film process, and a polyimide layer insulation film is formed on a laminated, sintered ceramic board, and conductor layers are formed of Cu or Al by a thin film process. A high-speed transfer of signals, as well as a high-density design, can be achieved by the use of a semiconductor process in which a dielectric constant of polyimide in the thin-film wiring portion is smaller than that of ceramics, and Cu or Al of a low resistance can be used; however, the number of packaged gates per unit area increases, and in order to deal with this, the number of the laminated thin-film wiring layers increases. In a basic process of a technique for forming thin-film multi-layer wiring, the patterning of a conductor layer, through holes and a polyimide layer on a ceramic board or a Si board is carried out by exposure and development of a photoresist. However, although this thin-film multi-layer formation process is suitable for making wiring minute, this process is a so-called sequential lamination method in which the conductor and the through holes are formed sequentially for each layer, and therefore when a thin-film wiring structure having many lamination layers is to be formed, great many times therefor is required. And besides, if a detect is produced at a final stage of the process, the whole of the board becomes defective, and as a result the yield rate is low, and hence the cost of the product becomes high. Furthermore, in a thin-film wiring, when the width of the wire is made minute in order to keep a wiring resistance to a low level, it is necessary to increase the thickness of the wire so as to secure a cross-sectional area thereof.

As a result, the thickness of the wiring layer is equal to or larger than the width of the wire, and therefore even by the use of a polyimide varnish having fluidity, it is difficult to secure flatness, and as the number of lamination layers increases, an accuracy of the wiring pattern is degraded, which often results in a problem that the cutting of the wire, as well as a short-circuit, occurs. Moreover, the ceramic board provided with input and output terminals and the thin-film wiring portions at the lower layers are repeatedly subjected to heat history and immersion in water and chemicals, and as a result the degradation of the interface, as well as the contamination by impurity ions, is encountered, so that the reliability is lowered.

There has been proposed another method (disclosed in Japanese Patent Unexamined Publication No. 63-274199) in which polyimide films having wirings formed thereon are laminated together at a time, and through hole portions are thermally pressed.

Although this method is quite effective in shortening a throughput time, the polyimide films in the form of a thin film are handled during the laminating process, and it is difficult to enhance the accuracy in the registration thereof, and the number of connection points is extremely increased, thus bringing about a drawback that the reliability of the connection portions is low.

In a multi-layer wiring board having thin-film wiring layers laminated on a ceramic board, there are raised such problems that the difference in thermal expansion coefficient between the ceramic substrate and the multi-layer wiring portions is large, and therefore in the formation of thin-film wiring layers into a multiplicity of layers, large-size construction, the board was broken during the laminating operation, and cracks developed in the thin-film wiring layer during the laminating operation, thus lowering the reliability of the product. When a multiplicity of thin-film wiring layers are to be formed on a ceramic board having a surface layer having a preformed wiring thereon, there is encountered a problem that the dimension of the wiring pitch of the surface layer does not correspond to that of the multi-layer thin film wiring portions. Referring to another problem, multi-chip module boards, having more than several LSIs mounted directly thereon, are classified into two kinds, that is, the type in which a ceramic material is used as a base, and the type in which an organic material is used as a base. In the case of the former, the board has low thermal expansive properties, and therefore the difference in thermal expansion coefficient between this board and the LSIs is small; however, the ceramic board has an inherent problem that green sheets shrink in different directions during sintering, so that it is difficult to make the wiring minute, and particularly to reduce the wiring pitch. Therefore, LSIs can not be mounted directly on the ceramic board, and by separately providing a thin-film wiring, the wiring pitch is caused to correspond to the pitch of terminals of output pins of the LSI. On the other hand, in the case of the latter, the organic material has an inherent problem that it has a high groscopicity, and therefore a dimensional change due to a humidity expansion occurs even while it is left in the atmosphere. Also, during laminating by the use of an adhesive, a dimensional change occurs under the influence of the adhesive. Therefore, as is the case with the ceramic board, it is difficult to make the wiring minute. Therefore, in this case, also, it is necessary to provide on the organic material board a thin-film wiring whose pitch can correspond to the pitch of terminals of output pins of the LSI.

SUMMARY OF THE INVENTION

The present invention has been made in order to solve the above problems, and the subject matter of the invention is as follows:

According to a 1st aspect of the present invention, there is provided a multi-layer wiring structure comprising a complex of at least two sub-assemblies each having wiring layers formed respectively on opposite sides of a core material through an insulation layer in such a manner that the wiring layers correspond in area ratio to each other, the core material being made of a low thermal expansive metal, and the sub-assemblies being connected together by conductors via through holes.

According to a 2nd aspect of the invention, there is provided a packaging board comprising a board having a thermal expansion coefficient of $1 \times 10^{-5}/°C.-1 \times 10^{-7}/°C.$;

and a multi-layer wiring structure formed on the board, the multi-layer wiring structure comprising a complex of at least two sub-assemblies each having wiring layers formed respectively on opposite sides of a core material through an insulation layer in such a manner that the wiring layers correspond in area ratio to each other, the core material being made of a low thermal expansive metal, and the sub-assemblies being connected to each other by conductors via through holes.

According to a 3rd aspect of the invention, there is provided an electronic part packaging board comprising a board having a thermal expansion coefficient of $1 \times 10^{-5}/°C.-1 \times 10^{-1}/°C.$; and a multi-layer wiring structure formed on the board, the multi-layer wiring structure comprising a complex of at least two subassemblies each having wiring layers formed respectively on opposite sides of a core material through an insulation layer in such a manner that the wiring layers correspond in area ratio to each other, the core material being made of a low thermal expansive metal, the sub-assemblies being connected to each other by conductors via through holes, and an electronic device being mounted on the packaging board.

In the above 1st to 3rd aspects, the core material is a metallic film having thickness of 0.01–1 mm, the metallic film being made of at least one kind selected from the group consisting of tungsten, molybdenum, an iron-nickel alloy, an iron-nickel-cobalt alloy, iron, nickel, and cobalt. A depth of the through hole is larger than an inner diameter of the through hole. An area ratio of the through holes to the multi-layer wiring layer is not more than 10%. The insulation layer has a dielectric constant of 2.2–4.7.

According to a 4th aspect of the invention, there is provided a multi-layer wiring structure comprising a complex of at least two sub-assemblies each having a wiring layer formed through an insulation layer on a surface of a core material of a metallic foil higher in elasticity modulus than copper, the sub-assemblies being connected to each other by conductors via through holes.

According to a 5th aspect of the invention, there is provided a multi-layer wiring structure comprising a complex of at least two sub-assemblies each having a wiring layer formed through an insulation layer on a surface of a core material of a metallic foil higher in elasticity modulus than copper, the sub-assembly being lower in thermal expansion coefficient than copper, and the sub-assemblies being connected to each other by conductors via through holes.

According to a 6th aspect of the invention, there is provided a packaging board comprising a board having not less than two layers of wiring formed therein; and a multi-layer wiring structure provided on one side or each side of the board, the multi-layer wiring structure being connected to the board by conductors via through holes, the multi-layer wiring structure comprising a complex of at least two sub-assemblies each having wiring layers formed through an insulation layer on opposite upper and lower surfaces of a core material of a metallic foil higher in elasticity modulus than copper, and the sub-assemblies being connected to each other by conductors via through holes.

According to a 7th aspect of the invention, there is provided an electronic device packaging board comprising a board having not less than two layers of wiring formed therein; and a multi-layer wiring structure provided on one side or each side of the board, the multi-layer wiring structure being connected to the board by conductors via through holes, the multi-layer wiring structure comprising a complex of at least two sub-assemblies each having wiring layers formed through an insulation layer on opposite upper and lower surfaces of a core material of a metallic foil higher in elasticity modulus than copper, and the sub-assemblies being connected to each other by conductors via through holes.

According to an 8th aspect of the invention, there is provided a method of producing a multi-layer wiring structure comprising the steps of (A) producing a sub-assembly having wiring layers formed respectively on both surfaces of a core material through an insulation layer in such a manner that the wiring layers correspond in area ratio to each other, the core material being made of a low thermal expansive metal; (B) laminating and bonding not less than two of the sub-assemblies sequentially or at a time to provide a complex; and (C) forming through holes in the complex, and connecting the sub-assemblies to each other by conductors by means of a plating treatment. The step (B) includes the step of applying a tensile load or a compressive load to each of the sub-assemblies while monitoring a dimensional change of the sub-assemblies during a bonding process, thereby controlling variations in dimensional change between the sub-assemblies to a range of +0.1–0.001%.

According to a 9th aspect of the invention, there is provided a method of producing a packaging board comprising the steps of (A) producing a sub-assembly having wiring layers formed respectively on surfaces of a core material through an insulation layer in such a manner that the wiring layers correspond in area ratio to each other, the core material being made of a low thermal expansive metal; (B) laminating and bonding not less than two of the sub-assemblies sequentially or at a time to provide a complex; (C) forming through holes in the complex, and connecting the sub-assemblies by conductors to provide a multi-layer wiring structure; (D) laminating and bonding the multi-layer wiring structure on one side or each side of a board having a thermal expansion coefficient of $1 \times 10^{-5}/°C.-1 \times 10^{-7}/°C.$; and (E) forming through holes in the laminate board, and connecting the multi-layer wiring structure and the board to each other by conductors. The step (D) includes the step of applying a tensile load or a compressive load to the multi-layer wiring structure or the board while monitoring dimensional changes of the multi-layer wiring structure and the board during a laminating and bonding process, thereby controlling variations in dimensional change between the multi-layer wiring structure and the board to a range of ±0.1–0.001%.

One example of board capable of directly mounting LSIs thereon is a board material made of ceramics. However, a dielectric constant of the ceramic material itself is high, and a molding temperature during the formation of the board is high, and therefore tungsten or molybdenum higher in resistance than copper is used as a wiring conductor. This is disadvantageous from the viewpoint of improving the speed of propagation of electrical signals. With respect to a new packaging method, in order that copper can be used as a wiring conductor, that a multi-layer circuit board, having insulation layers of a high polymeric organic substance having a low dielectric constant, and that a bare chip packaging can be achieved, the inventor of the present invention has thought it necessary to bring a thermal expansion coefficient of the multi-layer circuit board close to that of a LSI chip (thermal expansion coefficient of Si: $3.0 \times 10^{-6}$). In the present invention, in order to bring a linear thermal expansion coefficient of the multi-layer circuit board into a low thermal expansion coefficient, wiring sheet materials having a low thermal expansion coefficient are arranged in a multi-layer construction, thereby achieving the object of the present invention. The present invention relates to the multi-layer wiring structure, and the LSI packaging board for providing this multi-layer wiring structure having many layers of minute thin-film wiring portions formed on upper and lower sides of a ceramic or a silicon board. The low thermal expansive sheet laminated board, that is, the multi-layer wiring structure is divided into sub-assemblies including a plurality of wiring layers. The sub-assembly is a single independent wiring structure including a power layer and XY signal layers. When the sub-assemblies are laminated on a board of a low thermal expansion coefficient such as a ceramic board or a silicon board, a thermal stress is generated if the sub-assembly mismatches the board in thermal expansion coefficient. To prevent this, that is, to cause the sub-assembly to correspond to the board in thermal expansion coefficient, the sub-assembly is produced using a core material of a low thermal expansion coefficient as a base. Preferably, the core material is a metallic material having a low thermal expansion coefficient of $1\times10^5/°C.-1\times10^{-7}/°C.$, and tungsten, molybdenum, an iron-nickel alloy, an iron-nickel-cobalt alloy, and a composite material of such a metallic material substance and copper or a copper alloy are suitable. Particularly, an invar alloy, which is one of iron-nickel alloys, can be easily formed into a low thermal expansion coefficient, and by changing the content ratio of its components, the thermal expansion coefficient can be controlled. Therefore, this alloy is most preferred. An invar alloy can cooperate with copper or a copper alloy to form a composite material by means of cladding or other suitable method. In CIC (Cu Invar Cu) alloy which is one example of such composite material, copper covering a surface thereof has the effect of shielding the invar which is a magnetic material, and therefore there is an advantage that this alloy is suitably used at a wiring portion of the power layer among the thin-film wiring portions of the LSI packaging board. A great advantage of the sub-assembly produced using the core material of a low thermal expansion coefficient as a base is that a dimensional change (a pattern interval of a pattern on a mask used for a pattern formation is different from a pattern interval of the wiring finally obtained as a result of arranging the sub-assemblies in a multi-layer construction) produced when the sub-assembly is laminated on another sub-assembly or the board can be reduced greatly. The greater the mismatch of thermal expansion coefficient between the sub-assembly and the board is, the larger this dimensional change is, and also the higher the temperature of the adhesive is.

FIG. 1 shows a process of laminating patterned wiring sheets 1 (not including a core material of a low thermal expansive metal) on a board. The wiring sheet comprises a polyimide film 2 ($\alpha$: $19\times10^{-6}/°C.$, 25 μm thick) corresponding in thermal expansion coefficient (hereinafter referred to as "$\alpha$") to copper, and copper wirings 3 formed respectively on opposite sides or faces of the polyimide film 2. These wiring sheets were laminated in 1 to 10 layers on a board (mullite ceramics, $\alpha$: $4.0\times10^{-6}/°C.$, 3 mm thick) through adhesive films 4 (adhesion temperature: 250° C., $\alpha$: $60\times10^{-6}/°C.$, 25 μm thick) to form a multi-layer laminated board 6 having the wiring sheets. FIG. 2 shows dimensional changes obtained when the wiring sheets were laminated in 1 layer, 5 layers and 10 layers. A dimensional change rate (pattern interval of wiring after lamination/pattern interval of wiring before lamination−1) was as low as 0.5% for one layer, 0.15% for 5 layers, and 0.30% for 10 layers. Thus, the dimensional change increased proportionally with the increase of the number of laminations. FIG. 3 shows change amounts obtained when heating the wiring sheets (1 layer, 5 layers and 10 layers) and the mullite board. Thermal expansion coefficients $\alpha$ were found from integral values in curves representative of this amount, and $19\times10^{-6}/°C.$ for one layer of wiring sheet, $30\times10^{-6}/°C.$ for 5 layers, and $50\times10^{-6}/°C.$ for 10 layers were obtained. On the other hand, mullite has $4.0\times10^{-6}/°$ C., and therefore as the number of the layers increases, the mismatch of a increases. Thus, the mismatch of a and the dimensional change are correlated with each other, and therefore when the wiring sheets are to be laminated on a board of a low thermal expansion coefficient, such as a mullite board, it is necessary to form the wiring sheet into a low thermal expansion coefficient to cause it to match the board in thermal expansion coefficient, thereby reducing the dimensional change. As a material for constituting the wiring sheet, a two-layer film using polyimide generally equal in thermal expansion coefficient to copper is commercially available. However, a thermal expansion coefficient of such a copper-clad polyimide sheet is $18\times10^{-6}/°C.$, and thus mismatches that of a mullite board. If such copper-clad polyimide sheets are laminated on the mullite board, damage such as crack and fracture develops in the board. To overcome this problem, there has been conceived an idea that a core material having a thermal expansion coefficient of $1\times10^{-5}/°C.-1\times10^{-7}/°C.$, for example, an invar foil (Fe36—Ni alloy), is inserted in the copper-clad polyimide sheet. In this case, the core material need to have a low thermal expansion coefficient of $1\times10^{-5}/°C.-1\times10^{-7}°C.$ and a high modulus of elasticity. With this arrangement, the mismatch of thermal expansion coefficient between the copper-clad polyimide sheet and the mullite board can be reduced.

Table 1 shows variations of the thermal expansion coefficient in accordance with a change in thickness of the copper-clad polyimide sheet using the invar foil as the core material.

TABLE 1

| Structure of copper-clad polyimide sheet | Thickness of copper cladding (t μm) | Thermal expansion coefficient ($\times 10^{-6}/°C.$) | |
|---|---|---|---|
| | | Calculated value | Measured value |
| Copper cladding (t) Polyimide (25) Adhesive (25) Invar foil (25) (μm) | 5 | 3.4 | 5.3 |
| | 12 | 6.2 | 7.6 |
| | 18 | 7.7 | 8.1 |

By combining the copper-clad polyimide sheet with the invar foil, there can be provided the sheet which is made low in thermal expansion coefficient, and can be brought into a desired thermal expansion coefficient by changing the thickness of the copper cladding, and can also be brought into a thermal expansion coefficient close to a thermal expansion coefficient ($4.5\times10^{-6}/°C.$) of a mullite board. FIG. 4 shows a warp obtained when copper-clad polyimide sheets were laminated on a mullite board. When polyimide sheets with no invar foil inserted therein were laminated, a warp increased as the number of laminated layers increased, and a warp of about 50 μm was produced at a lamination thickness of 400 μm, so that micro-cracks developed in the board. On the other hand, in the case of copper-clad polyimide sheets having invar sheets inserted therein, a warp was reduced to about ⅕ of that obtained with the polyimide sheets having no invar sheet, and even at a lamination thickness of 1 mm, the warp was kept to less than 50 μm, and no damage was found in the board at all.

Further, according to the present invention, in order to cause a wiring sheet to have a low thermal expansion coefficient, there is provided a wiring structure (hereinafter referred to as "sub-assembly") which is formed by preparing a sheet comprising a low thermal expansive metallic foil (serving as a core material and having a thickness of 0.01–1 mm) having an insulation film provided on each side thereof, and then by forming a wiring pattern on a surface of this sheet at low temperatures (not more than 100° C.) by an additive method. With respect to the construction of the wiring, when the core material is used as a power layer, one or two signal wiring layers are formed on each side of this layer. The thermal expansion coefficient of the sub-assembly is determined by the thermal expansion coefficient and thickness of the core material, and can be controlled into a range of $1\times10^{-5}$/°C.–$1\times10^{-7}$/°C. by selecting the above-mentioned metallic material. Therefore, in the present invention, the mismatch of the thermal expansion coefficient with the board can be kept at a maximum to $1\times10^{-6}$/°C., and when the board size is 200 mm, a dimensional change can be reduced to 0.1–0.001% (not more than ±20 μm). By thus reducing the dimensional change amount, the density of the wiring on the packaging board can be enhanced. With respect to conventional multi-layer printed boards, there is available means by which sheets having a preformed wiring pattern are laminated either at a time or sequentially to form a multi-layer wiring board; however, it is difficult to control a thermal expansion coefficient of the sheet material, and a dimensional change of more than 0.1% is produced before and after the lamination. Therefore, in order to overcome a displacement (position change) of the wiring pattern due to such a dimensional change, the area of a pad portion receiving a through hole connecting between the wiring layers is made sufficiently larger than that required from the viewpoint of electrical characteristics, thus dealing with the above problem. In the present invention, the dimensional change can be kept to not more than 1/5 as compared with the conventional techniques, and therefore the area of the pad portion can be kept to not more than 1/25. As a result, the ratio of the total area assigned to the pad portions can be not more than 1%. Namely, if the pattern is designed most efficiently, an electrical connection between layers can be obtained by through holes which are landless. As a result, a signal circuit leading to an LSI chip can be connected not via a redundant circuit, but by vertically-extending through holes of the pedestal type. Explanation will be now made based on data of tests conducted by actually producing sub-assemblies. FIG. 5 shows a thermal expansion coefficient of sub-assemblies using a metallic foil (50 μm thick) of a low thermal expansion coefficient as a core material. In FIG. 5, Type A indicates a thermal expansion coefficient of a sub-assembly using an invar alloy as a core material. Type B indicates a thermal expansion coefficient of a sub-assembly using a composite material of copper and invar alloy as a core material, and Type C indicates a thermal expansion coefficient of a sub-assembly using a composite material of copper and tungsten as a core material. For comparison purposes, Type D indicates a thermal expansion coefficient of a sub-assembly using copper as a core material. In any of these sub-assemblies, since the thermal expansion coefficient varies depending on the volume of a signal layer formed at an outer layer, a variation of the thermal expansion coefficient for an area ratio of a copper wiring is shown. An area ratio of a copper wiring portion in a signal circuit of a common multi-layer printed board is 5–20%. Among the three types, the sub-assembly of Type A has the lowest thermal expansion coefficient, and when the area ratio was in the range of 5–20%, the thermal expansion coefficient was $2.4\times10^{-6}$/°C.–$3.8\times10^{-6}$/°C. Similarly, the thermal expansion coefficient of Type B was $3.6\times10^{-6}$/°C.–$4.8\times10^{-6}$/°C. In Type C, since the elasticity modulus of tungsten is high, the thermal expansion coefficient hardly depended on the area ratio of the copper wiring portion, and was $4.8\times10^{-6}$/°C.–$4.9\times10^{-6}$/°C.. Similarly, in Type D, a variation in thermal expansion coefficient was not seen, and it was generally constant, and was $1.8\times10^{-6}$/°C. FIGS. 6A and 6B show multi-layer wiring structures 7 and 8, respectively, which were produced using two kinds (Type B and Type D) of sub-assemblies (thickness of core material: 50 μm; thickness of copper wiring at outer layer: 18 μm; overall thickness: 100 μm), respectively, which sub-assemblies were laminated on a mullite ceramic board (thickness: 3 mm, size (square shape): 200 mm×200 mm; thermal expansion coefficient: $4.0\times10^{-6}$/°C.) by adhesive films (N4 manufactured by Hitachi Kasei Kogyo K. K.; adhesion temperature: 250° C.). In both of the sub-assembly 9 of Type B and the sub-assembly 10 of Type D used for laminating purposes, an area ratio of a copper wiring portion 11, 12 of a signal circuit was 10%.

FIG. 7 shows a warp of the board, as well as damage (separation and crack) of the board, in accordance with the degree of lamination of the sub-assemblies. In this case, the mismatch of the thermal expansion coefficient with the board was $1.0\times10^{-6}$/°C. in Type B, and was $1.4\times10^{-6}$/°C. in Type D. In Type D, when four sub-assemblies were laminated to provide a lamination thickness of 400 μm, a warp of 50 μm was observed, and micro-cracks developed in the surface of the board, and separation occurred at an end surface of the board. Further, when the lamination thickness exceeded 800 μm, the warp exceeded 100 μm, and a crack developed at the lamination thickness of 1 mm. On the other hand, in Type B, when 10 sub-assemblies were laminated to provide a lamination thickness of 1 mm, a warp was still 50 μm, and any damage such as cracks were not found. As seen in Type B, when the mismatch of the thermal expansion coefficient with the board is within the range of $1.0\times10^{-6}$/°C., the sub-assemblies can be laminated into a multi-layer construction.

Next, a dimensional change, obtained when laminating sub-assemblies on a ceramic board to provide a multi-layer construction, was examined. The sub-assemblies used had the same construction (thickness of core material: 50 μm; thickness of copper wiring at outer layer: 18 μm; area ratio of copper wiring portion: 10%; overall thickness: 100 μm) as shown in FIG. 7. With respect to the thermal expansion coefficient of each of the sub-assemblies, Type A was $3.3\times10^{-6}$/°C., Type B was $4.1\times10^{-6}$/°C., Type C was $4.9\times10^{-6}$/°C., and Type D was $1.8\times10^{-6}$/°C. FIG. 8 shows a dimensional change obtained when laminating these sub-assemblies on a ceramic board (thickness: 3 mm; size (square shape): 200 mm×200 mm) by the use of an adhesive film (N4 manufactured by Hitachi Kasei Kogyo K. K.; adhesion temperature: 250° C.). The ceramic boards used were three kinds, that is, mullite (thermal expansion coefficient: $4.0\times10^{-6}$/°C.), alumina (thermal expansion coefficient: $6.5\times10^{-6}$/°C.) and cordierite (thermal expansion coefficient: $3.5\times10^{-6}$/°C.). The value of the dimensional change was expressed using the following formula, and the measured distance between gauge marks was 150 mm.

Dimensional change rate=pattern interval of outer layer copper wiring after lamination−pattern interval of outer layer copper wiring before lamination/pattern interval of outer layer copper wiring before lamination×100(%)

When the lamination is formed on the alumina board, the dimensional change of Type C was the smallest, and was 0.02%. The reason for this is that the mismatch of the thermal expansion coefficient with the board is small on the order of $1.6 \times 10^{-6}/°C$. Similarly, with respect to the other ceramic boards, when the mismatch of the thermal expansion coefficient with the board is small, the dimensional change of the sub-assembly tends to be small. With respect to the mullite board, Type B (mismatch: $1.0 \times 10^{-6}/°C$.) is the smallest on the order of 0.005%, and with respect to the cordierite board, Type A (mismatch: $2.0 \times 10^{-6}/°$ C.) is the smallest on the order of 0.01%. Thus, even if any of the ceramic boards is used, the thermal expansion coefficient of the sub-assembly can be caused to match that of the board by properly selecting the core material of the sub-assembly, so that the dimensional change can be reduced. In view of the foregoing, for forming a multi-layer wiring on a ceramic board, it is important to select the sub-assembly material which can match the ceramic material. By judging from values of characteristics of the core material such as a volume fraction, a thermal expansion coefficient and an elasticity modulus, the layer construction of the sub-assembly can be optimized. For example, in order to prevent a warp from developing in the board, the sub-assembly need to have such a structure that the laminate materials are arranged symmetrically, and that the laminate materials are dispersed as uniformly as possible so that a stress will not concentrate between the layers.

For mounting LSIs on a conventional multi-chip module board, it has been necessary to provide a separate thin-film wiring on the board. However, with respect to the structure of the sub-assembly, since a dimensional change is quite small, a wiring can be made microscopic. Therefore, a microscopic wiring which can correspond in pitch to output pins of the LSI can be formed on the surface of the multi-layer wiring structure constituted by a complex of sub-assemblies, and the LSI can be mounted directly thereon. If the sub-assembly is bonded to one or both sides of a board made of an organic material or a ceramic material, this can be used as a chip carrier, and therefore an LSI can be mounted directly on the board through the sub-assembly which board does not necessarily match the LSI in thermal expansion coefficient.

As described above, by causing the core material of the sub-assembly to have a low thermal expansion coefficient, the reduction of the dimensional change can be achieved. However, the materials (copper, polyimide, adhesive material, metal of the core material) constituting the sub-assembly, as well as the board to which the sub-assembly is to be bonded, differ in thermal expansion coefficient and elasticity modulus from one lot to another, and vary delicately. There are occasions when from the viewpoint of electrical characteristics of the signal circuit, the kind of the core material and the thickness thereof are limited, so that it is difficult to cause the board to completely match the sub-assembly in thermal expansion coefficient. Therefore, there is also required a method of reducing a dimensional change when the materials different in thermal expansion coefficient are to be bonded together. As a countermeasure from a hardware point of view in a process of actually producing the laminate board, a dimensional change of each material caused by heating during the laminating process is monitored in situ so as to reduce the dimensional change, so that the dimensional change to be finally obtained can be made constant.

The thin-film wiring is divided into the sub-assemblies having a plurality of wiring layers, and the sub-assemblies are connected together through the through holes. The reason for providing this structure is that the thin-film wiring layer can be dividedly formed on each of the sub-assemblies, and that by sorting good sub-assemblies from defective sub-assemblies before the sub-assemblies are connected together, the final yield rate can be greatly enhanced. Furthermore, by producing the sub-assemblies in a parallel manner, the time required for producing the packaging board can be greatly reduced. The reason why the sub-assembly has such a structure that the power layer or the ground layer is used as the core, with the signal layers provided as outer layers thereon, will now be explained. The power layer or the ground layer is basically a solid film, and therefore by providing the metallic foil, having a low thermal expansion coefficient and a high rigidity, at this portion, the dimensional change developing during the formation of the signal wiring layer can be suppressed, and also the reliability of the connection of the through hole portions can be enhanced.

DESCRIPTION OF THE PREFERRED EMBODIMENTS

EXAMPLE 1

Figure 1:
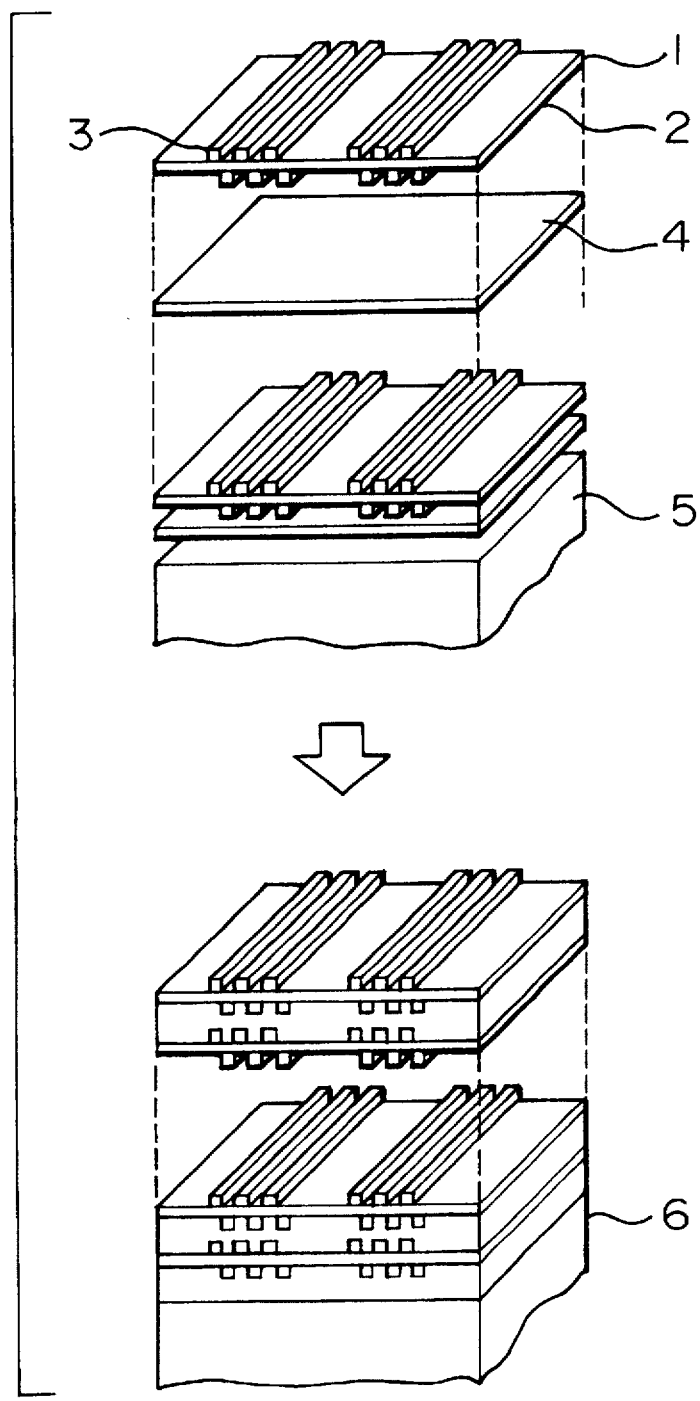
FIG. 1 is a view showing a process of forming wiring sheets into a multi-layer construction.
Figure 2:
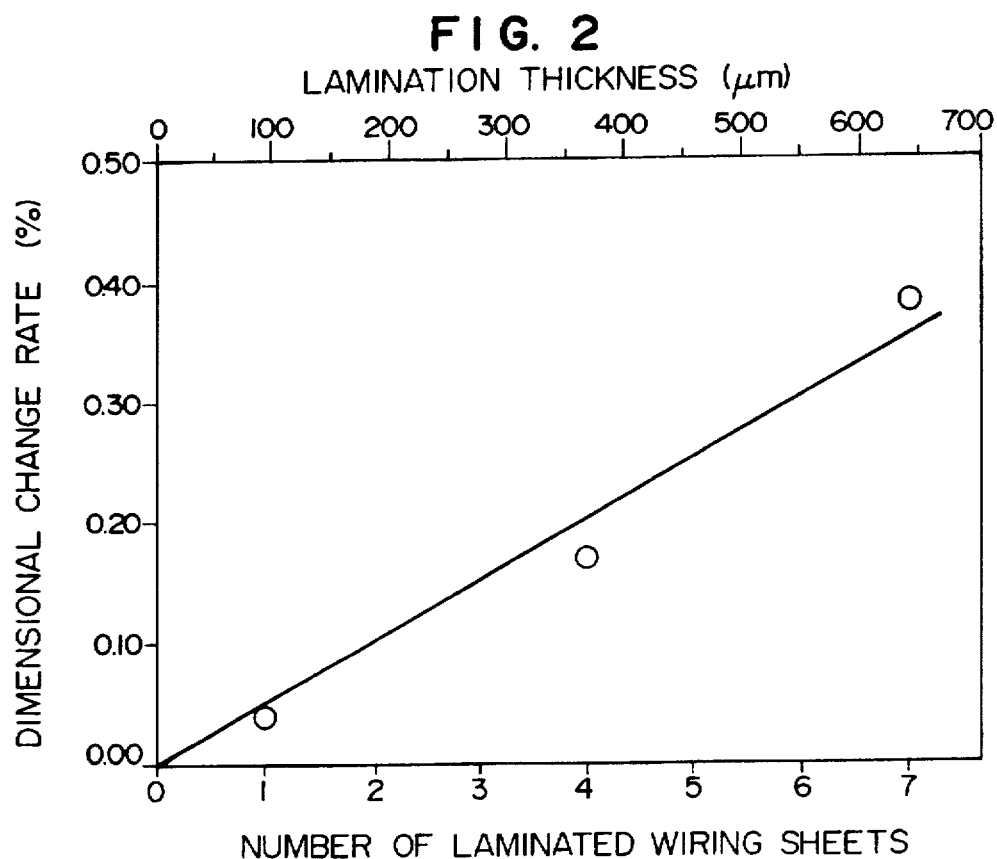
FIG. 2 is a diagram showing a dimensional change obtained when laminating wiring sheets on a ceramic board by the use of adhesive films.
Figure 3:
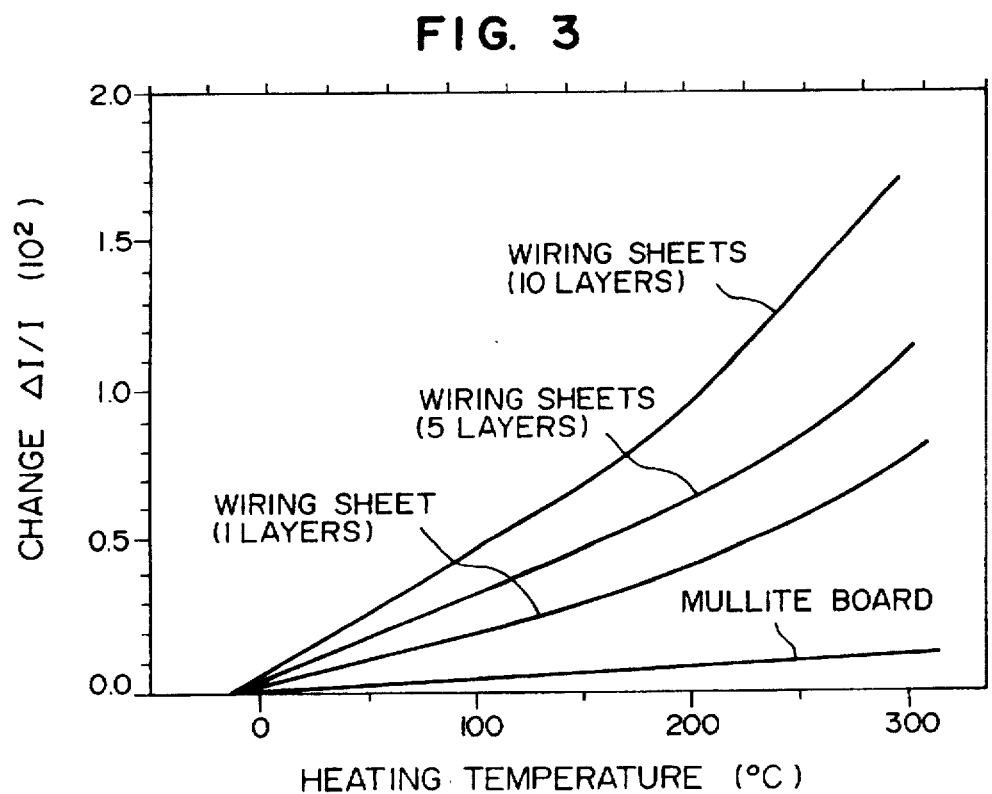
FIG. 3 is a diagram showing variations of a thermal expansion coefficient in accordance with the number of laminated wiring sheets.
Figure 4:
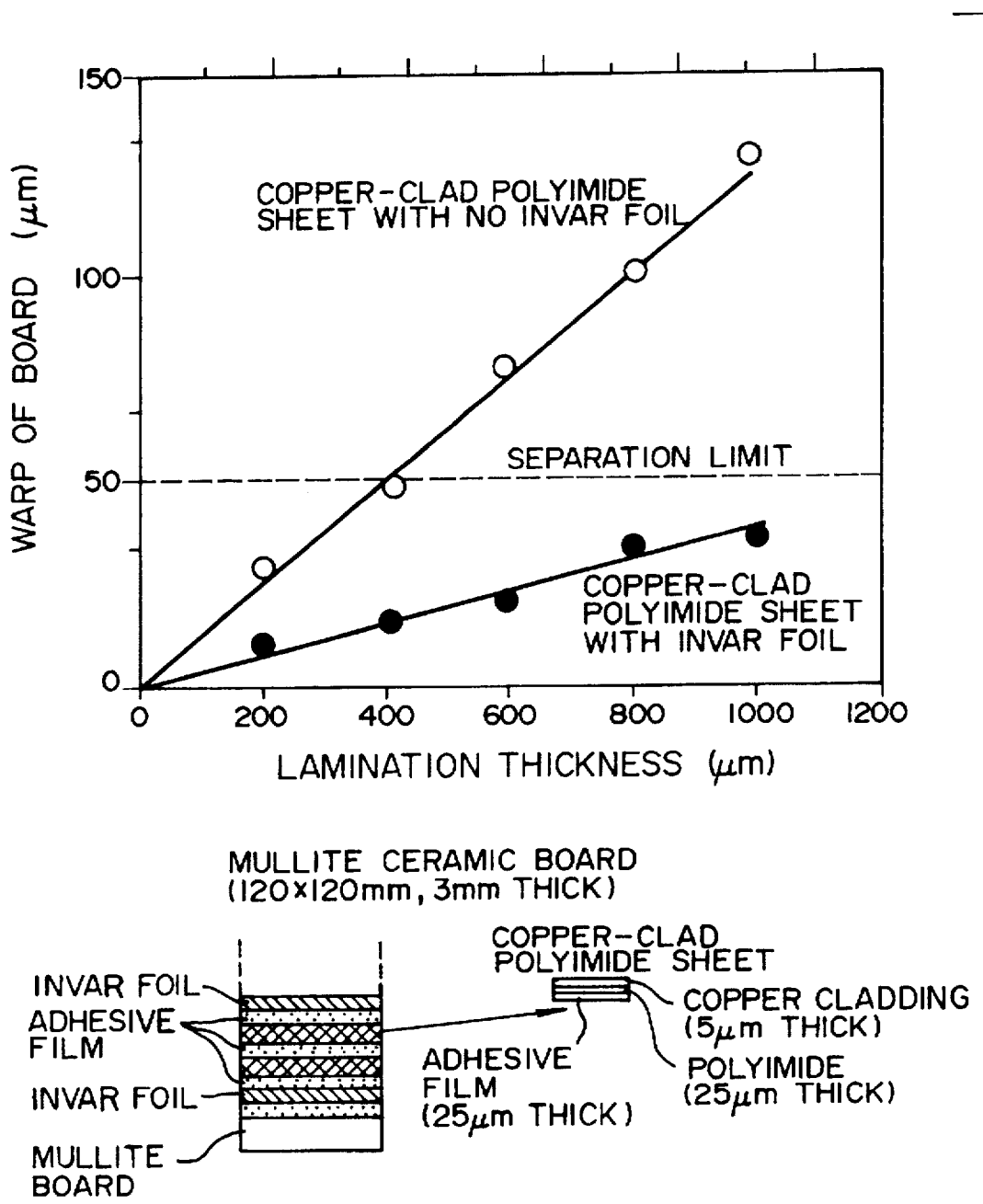
FIG. 4 is an illustration showing a warp and damage of a board in accordance with the number of laminated wiring sheets.
Figure 5:
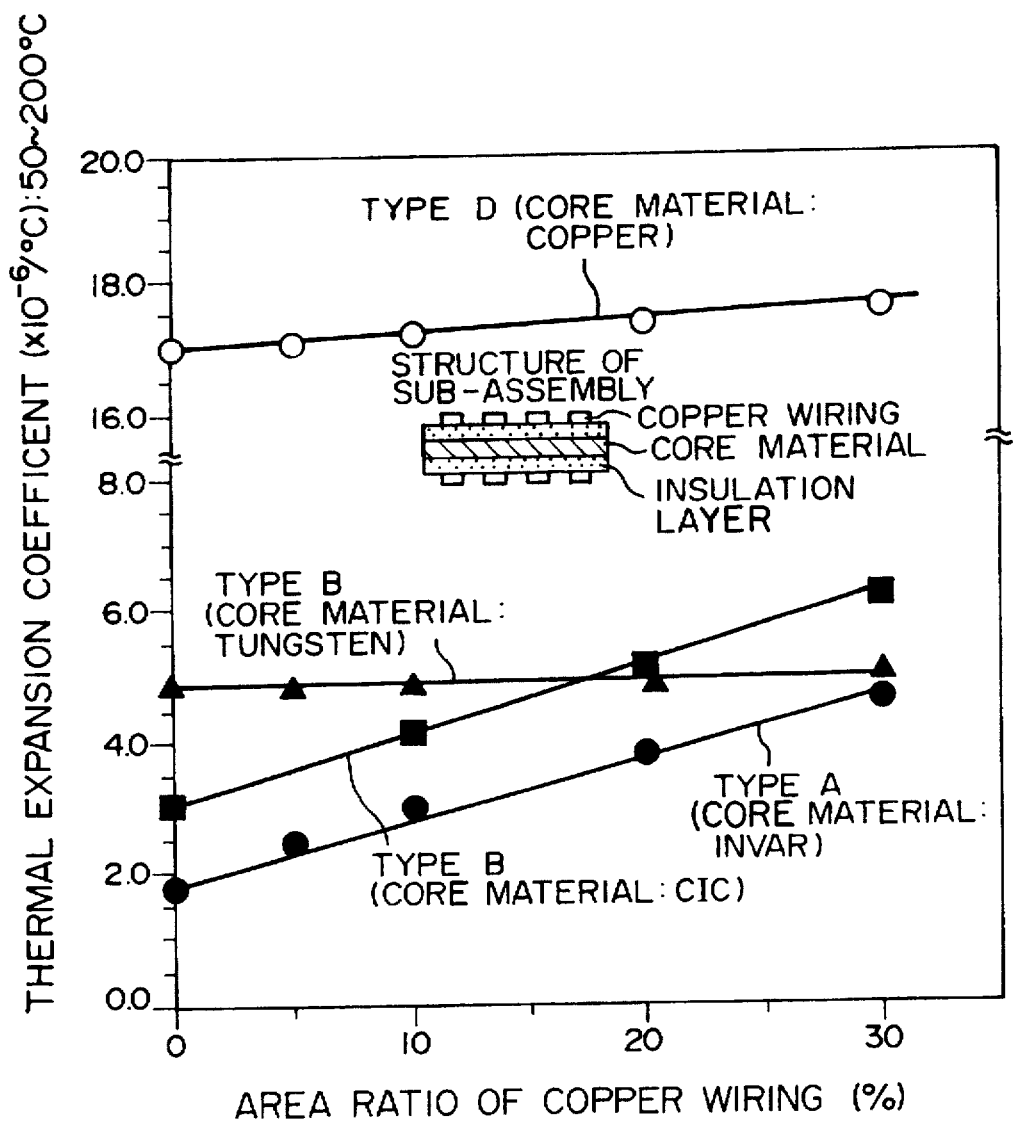
FIG. 5 is an illustration showing a thermal expansion coefficient of sub-assemblies using a metallic foil (50 µm thick) of a low thermal expansion coefficient as a core material.
Figure 6A:
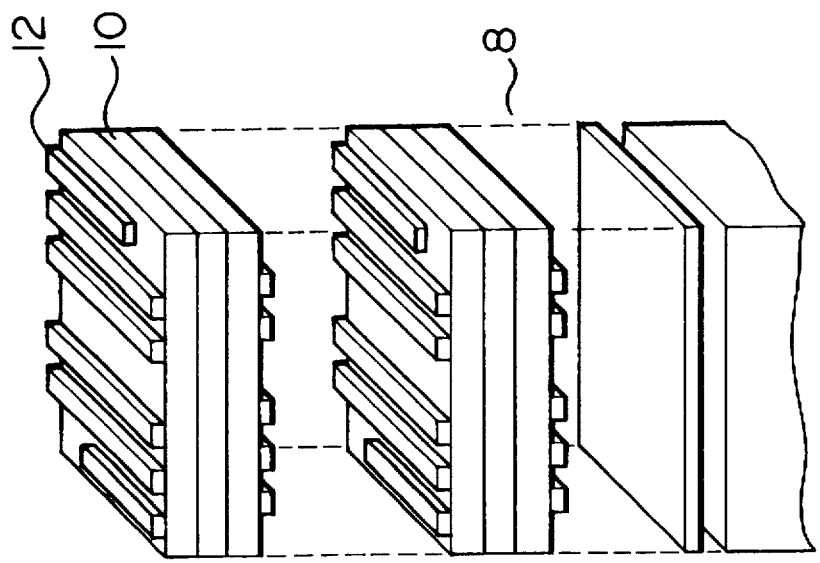
FIGS. 6A and 6B are views respectively showing the structures of sub-assemblies respectively using a metallic foil and a copper foil of a low thermal expansion coefficient as a core material.
Figure 6B:
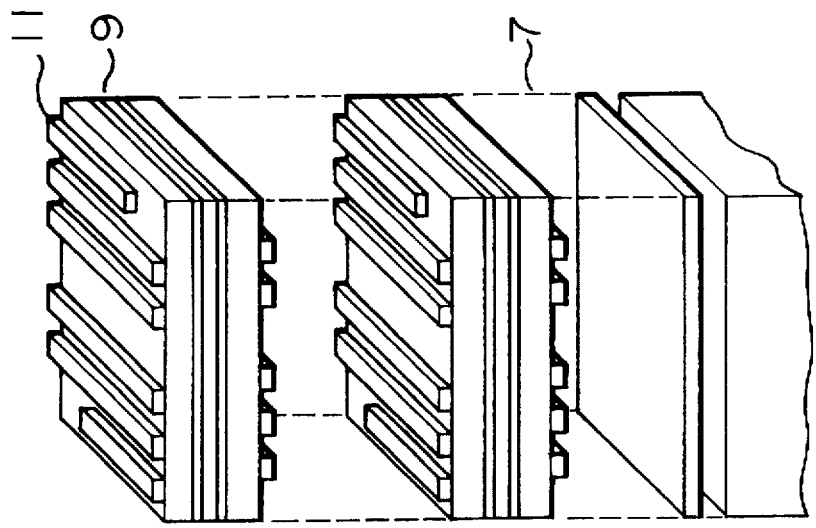
Figure 7:
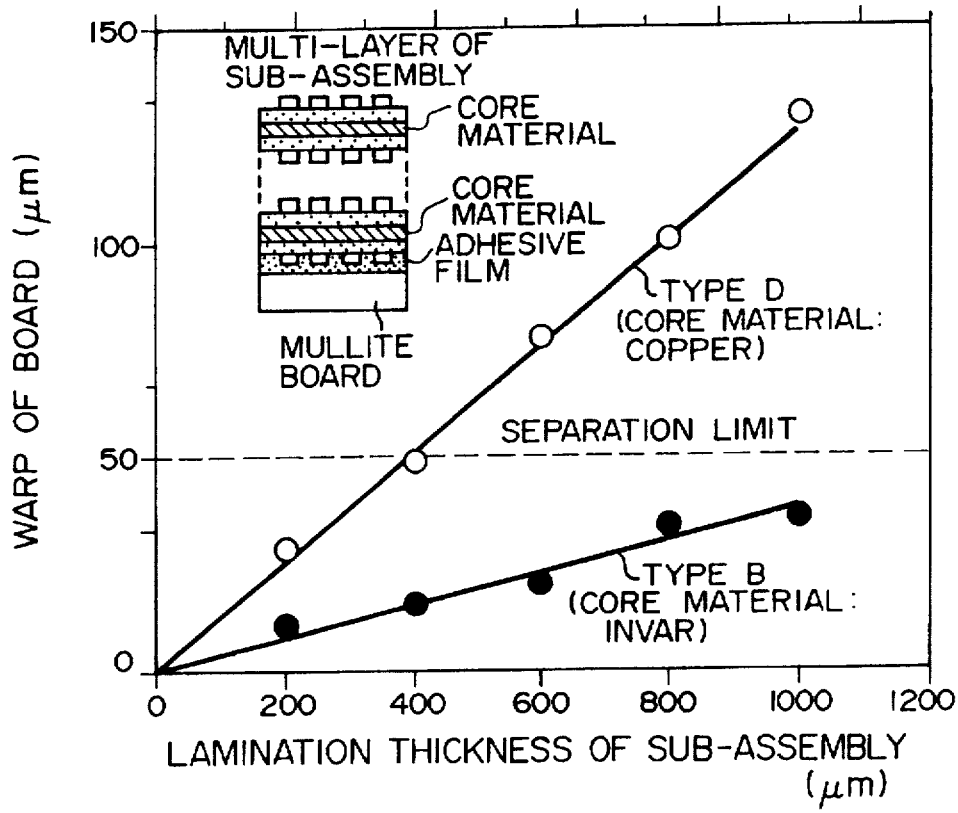
FIG. 7 is an illustration showing a warp and damage of a board in accordance with the number of laminated sub-assemblies.
Figure 8:
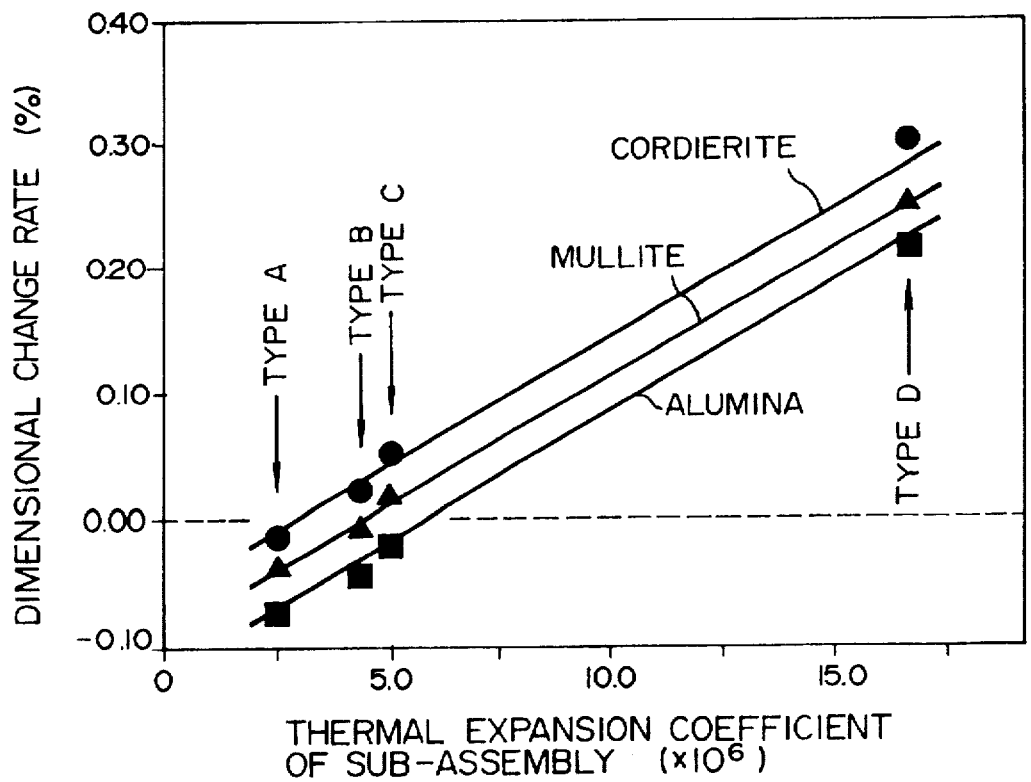
FIG. 8 is a diagram showing a dimensional change obtained when laminating sub-assemblies on a ceramic board by the use of adhesive films.
Figure 9:
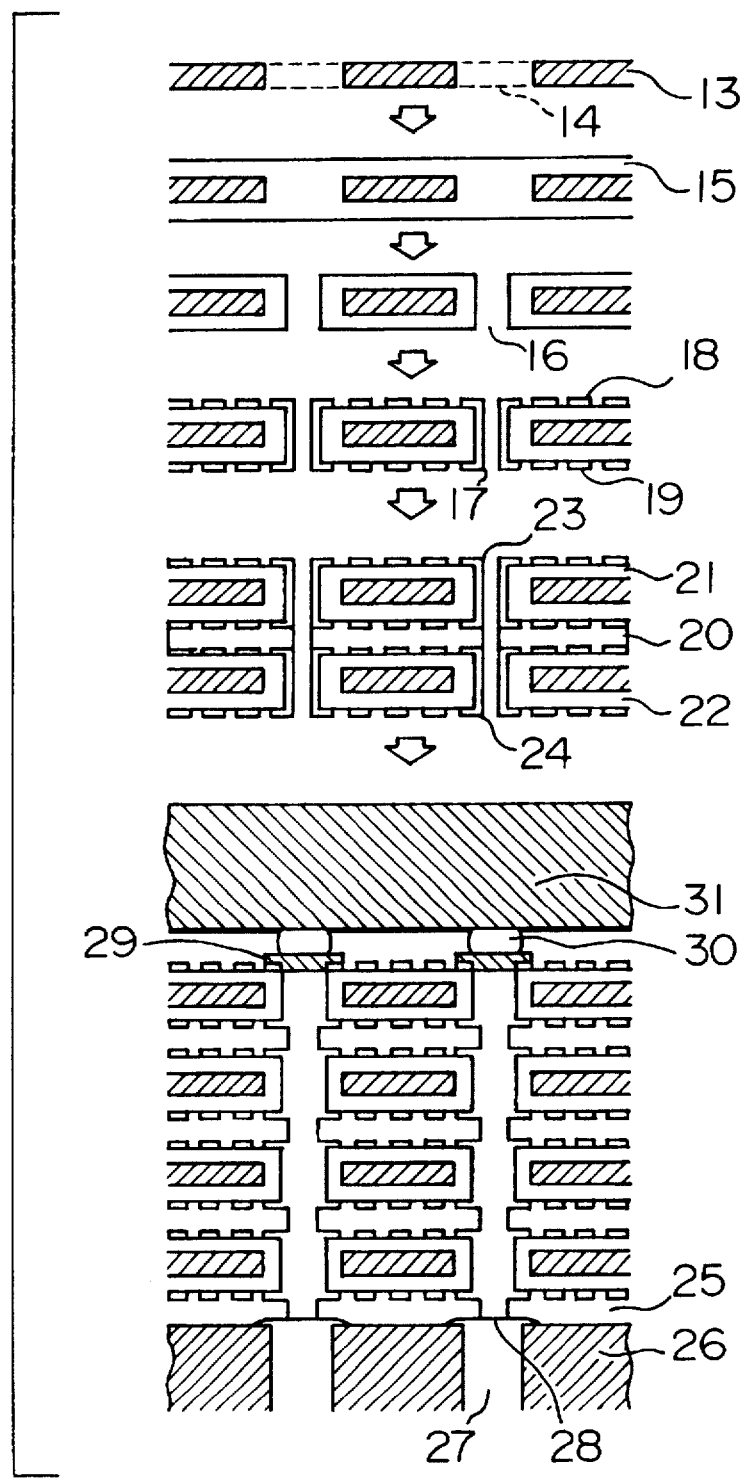
FIG. 9 is a view showing a process of producing a multi-chip module using sub-assemblies.

It has been confirmed that by using sub-assemblies, a multi-layer wiring can be formed on a ceramic board, with a dimensional change hardly produced. Therefore, an LSI chip-packaging module obtained by laminating sub-assemblies into a multi-layer construction will now be described. FIG. 9 shows a cross-section of a portion of a multi-chip module in which LSI chips are mounted by a flip chip bonding method on a multi-layer wiring on a ceramic board. This module is obtained by laminating two sub-assemblies, and if more than two sub-assemblies are laminated, the reliability of LSI chip connection portions is not affected. An example of a process of producing this module will now be described. A CIC (Cu Invar Cu) alloy foil 13 (copper: 5 μm thick, combined thicknesses: 10 μm; Invar: 40 μm thick) was selected as a core material, and through holes 14 (having a diameter of 50 μm) were first formed through the core material by a YAG laser or etching (by dissolving in a ferric chloride solution). Then, an insulative film 15 (film thickness: 25 μm; combined thicknesses: 50 μm) was formed on both sides of the core material. This can be achieved by a method of coating polyimide varnish (PIQ-L100 manufactured by Hitachi Kasei Kogyo K. K.; optimum curing temperature: 350°–400° C.) onto the both sides of the core material, and then thermosetting it, or a method of bonding a polyimide film to each side of the core material by an adhesive film. Then, through holes 16 (having a diameter of 50 μm) for interconnecting layers were formed through the insulative film by Ekishima laser, and through hole connections 17, as well as signal wiring layers 18 and 19 in X and Y directions on the both sides of the insulative film, were formed by a selective plating method. Two sub-assemblies thus obtained were bonded to each other by an adhesive film 20 (N4 manufactured by Hitachi Kasei Kogyo K. K.; adhesion temperature: 250° C.). In this bonding step, in order to bring the upper and lower sub-assemblies 21 and 22 into registry with each other, the positions of corresponding through hole portions 23 and 24 of the upper and lower sub-assemblies were optically recognized, and then the two sub-assemblies were provisionally bonded to each other at a temperature lower than the adhesion temperature, and then a complete bonding between the two was carried out. The two sub-assemblies were laminated on a mullite ceramic board 26 by an adhesive film 25 by a similar process (complete bonding was carried out after provisional bonding). Further, residues of the adhesive film were removed by a dry etching method (for example, RF plasma; reaction gas: $O_2$—$CF_4$), and then in order to electrically connect the sub-assembly portion to inner wiring 27 of the board, a copper film 28 were filled in the through hole portions by a chemical plating method. Further, a surface layer (Cr/Ni/Au) 29 was formed on the top of this assembly, and an LSI chip 31 was connected to this surface layer by solder balls 30, using a flip chip bonding method.

EXAMPLE 2

Figure 10:
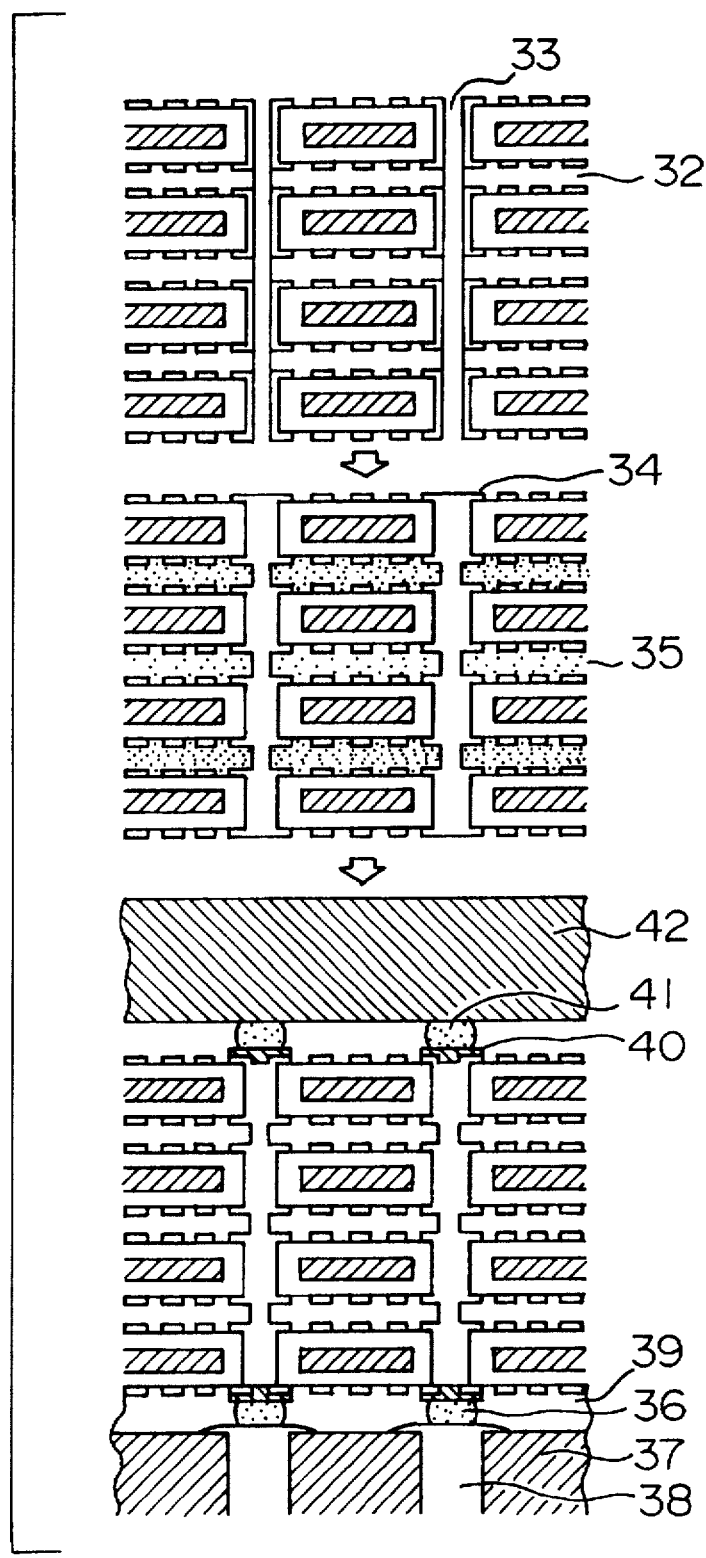
FIG. 10 is a view showing a process of producing a multi-chip module by using sub-assemblies in combination with a micro-bump connection technique.

FIG. 10 shows a process of producing another example of LSI chip-packaging module board comprising sub-assemblies, and more specifically shows a construction in which the sub-assemblies are laminated on a ceramic board by the use of microbumps. By a chemical plating method, a copper film 34 was filled in through hole portions 33 in a wiring structure 32 which was obtained by bonding four sub-assemblies together according to the same procedure as in FIG. 9. In this case, a similar through hole connection can be obtained by other method such as a method of filling copper paste in the through hole portions, and then baking this paste. Two pairs of sub-assemblies were bonded to each other according to a similar process, and conductors were connected to provide a multi-layer wiring structure 35. Then, microbumps (Au) 36 were formed on inner wiring 38 of a mullite ceramic board 37, and the multi-layer wiring structure was bonded to the board by a pressure bonding method (pressure: 30–50 g/bump; bonding temperature: 200°–400° C.). Further, in order to enhance the reliability of the connection portion, an insulative resin film 39 was filled in a gap between the sub-assemblies and the board. Finally, a surface layer 40 (Cr/Ni/Au) was formed, and then an LSI chip 42 was connected to this surface layer by solder balls 41, using a flip chip bonding method.

Since the sub-assembly has such a structure that a dimensional change thereof is quite small, the wiring can be made microscopic. Therefore, a microscopic wiring which can match the pitch of output pins of an LSI can be formed on the multi-layer wiring structure comprising a complex of sub-assemblies, and the LSI can be mounted directly on the multi-layer wiring structure. If the sub-assembly is bonded to one or both sides of a board of an organic material or a ceramic material, this can be used as a chip carrier, and therefore an LSI can be mounted directly on the board, which does not necessarily match the LSI in thermal expansion coefficient, through the sub-assembly.

EXAMPLE 3

Figure 11:
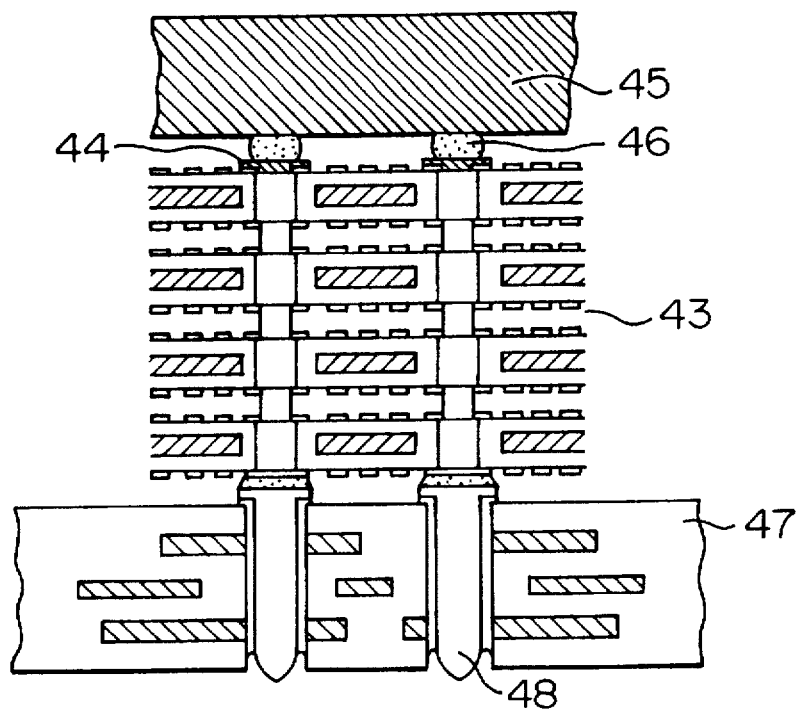
FIG. 11 is a view of a multi-chip module formed by using only sub-assemblies.

FIG. 11 shows an applied example in which a multi-chip module is constituted only by sub-assemblies. Using a flip chip bonding method, an LSI chip 45 is mounted by solder balls 46 on a surface layer 44 on a multi-layer wiring structure 43 comprising four sub-assemblies, and the LSI is connected to a power board 47 via output pins 48.

EXAMPLE 4

Figure 12:
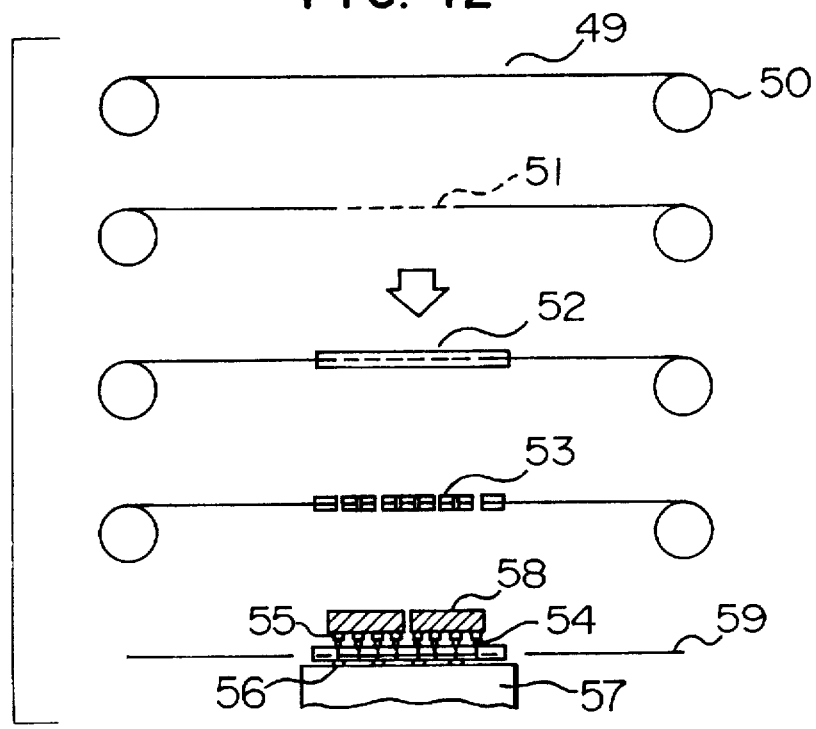
FIG. 12 is a view of a multi-chip module using sub-assemblies produced by a roll-to-roll process.

FIG. 12 shows one example of a process for mass producing a module board comprising sub-assemblies. In this process, a CIC foil 49 serving as a core material is continuously supplied by a roll 50, thereby achieving a labor saving effect. In this method, the formation of holes 51 through the core material, the formation of an insulation layer 52 and the formation of through holes 53 are all carried out in a continuous process of a roll-to-roll process. In a final step, a surface layer 54 was formed, and then a ceramic board 57 and LSIs 58 were bonded by solder bumps 55 and 56, and then the core material was cut off from a roll 59.

EXAMPLE 5

Figure 13:
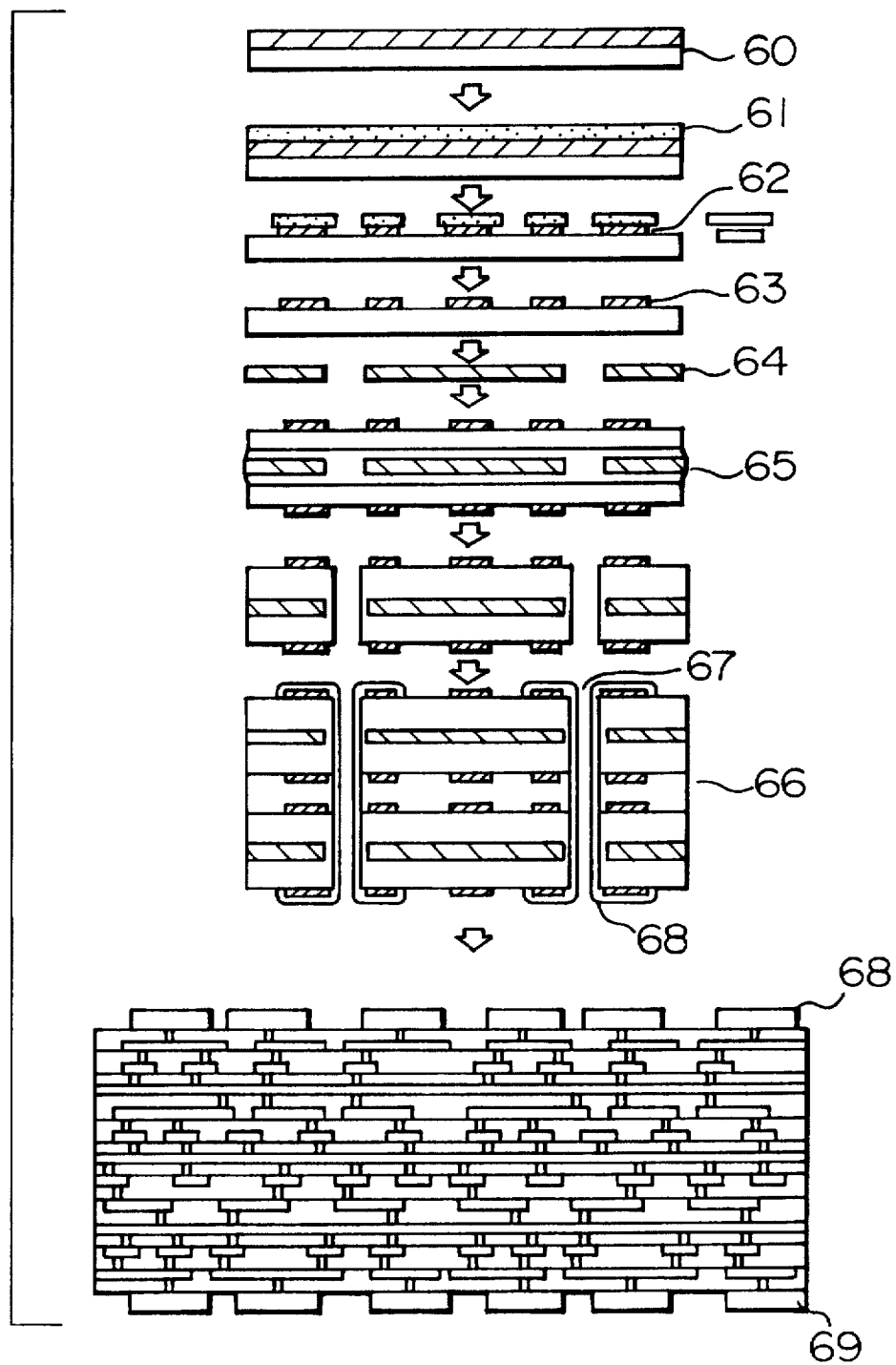
FIG. 13 is a view of a double-sided LSI packaging board comprising a complex of sub-assemblies.

FIG. 13 shows a process of producing a double-sided LSI packaging board using sub-assemblies. A resist film 61 was provided on a copper-clad polyimide film 60 (hereinafter referred to as "MCF"; polyimide film thickness: 10–50 μm; copper cladding thickness: 10–50 μm; square shape one side of which is 50–200 mm), and after exposure and development, the copper was etched to form a copper wiring pattern 62. Further, in order to enhance a bonding property, a pretreatment (for example, a blackening treatment) was applied to the copper wiring.

Then, a copper/invar/copper-clad sheet 64 (film thickness: 25–50 μm) having preformed through holes was interposed between two MCFs thus patterned, and a pattern registration was optically effected, and then they were bonded provisionally (for example, by solder or an ultraviolet-curing resin), and then were formed into an integrally-bonded construction 65 through an adhesive film by a press. The complexes thus obtained were bonded together by a similar process to provide a wiring structure 66. Through holes 67 having a diameter of 30–70 μm were formed through this wiring structure by the use of Ekishima laser. Then, the wiring structure was treated by a palladium catalyst solution. Then, a resist film was formed on the copper wiring side, and was exposed and developed, and the resist on the through hole portions was removed. Then, a conductor layer was formed on these through hole portions by electroless plating to electrically connect the metal wirings between the two layers.

By repeating the above process, copper wiring layers and copper/invar/copper wiring layers were laminated to provide a thin film-thick film multi-layer wiring board (having a square shape one side of which was 50–200 mm) comprising 20 metal wiring layers, this multi-layer wiring board having LSIs 68 and 69 mounted on opposite sides thereof.

As described above, in the present invention, the thin-film multi-layer wiring having many laminate layers can be produced in such a manner that the multi-layer wiring is divided into the sub-assemblies, and the sub-assemblies can be inspected one by one. Therefore, advantageously, the yield rate is markedly improved as a whole, and the throughput can be reduced.

Since the wiring structure having the core material of a low thermal expansion coefficient is used as a base, a dimensional change is small, and therefore the signal layer having wires having a microscopic width can be formed at the outer layer, and the registration accuracy for connecting the sub-assemblies together can be improved, thereby enhancing the reliability. Furthermore, if a computer is produced using the packaging boards of the present invention, the overall reliability of the computer can be enhanced. The core material serving as the base material of the sub-assembly can be supplied in a continuous step of a roll-to-roll process, and therefore a multi-chip module board can be produced at low costs, and can be used in personal computers, work stations and the like.

What is claimed is:

1. A multi-layer wiring structure comprising a complex of at least two sub-assemblies each having wiring layers formed respectively on both sides of a core material through an insulation layer in such a manner that said wiring layers correspond in area ratio to each other, said core material being made of at least one metal selected from the group consisting of tungsten, molybdenum, an iron-nickel alloy, an iron-nickel-cobalt alloy, iron, nickel and cobalt, said sub-assemblies being connected to one another by conductors via through holes, said conductors being formed by filling the through holes by plating or addition of paste, such that the through holes are filled with said conductors, and the sub-assemblies being laminated together by adhesive films.

2. A packaging board comprising a board having a thermal expansion coefficient of $1 \times 10^{-5}/°C.–1 \times 10^{-7}/°C.$; and a multi-layer wiring structure formed on said board, said multi-layer wiring structure comprising a complex of at least two sub-assemblies each having wiring layers formed respectively on both sides of a core material through an insulation layer in such a manner that said wiring layers correspond in area ratio to each other, said core material being made of at least one metal selected from the group consisting of tungsten, molybdenum, an iron-nickel alloy, an iron-nickel-cobalt alloy, iron, nickel and cobalt, said sub-assemblies being connected to one another by conductors via through holes, said conductors being formed by filling the through holes by plating or addition of paste, such that the through holes are filled with said conductors, and the sub-assemblies being laminated together by adhesive films.

3. An electronic device packaging board comprising a board having a thermal expansion coefficient of $1 \times 10^{-5}/°C.–1 \times 10^{-7}/°C.$; and a multi-layer wiring structure formed on said board, said multi-layer wiring structure comprising a complex of at least two sub-assemblies each having wiring layers formed respectively on both sides of a core material through an insulation layer in such a manner that said wiring layers correspond in area ratio to each other, said core material being made of at least one metal selected from the group consisting of tungsten, molybdenum, an iron-nickel alloy, an iron-nickel-cobalt alloy, iron, nickel and cobalt, said sub-assemblies being connected to one another by conductors via through holes, said conductors being formed by filling the through holes by plating or addition of paste, such that the through holes are filled with said conductors, and being laminated together by adhesive films, and an electronic device being mounted on the packaging board.

4. A structure according to any one of claims 1 to 3, wherein said core material is a metallic film having thickness of 0.01–1 mm.

5. A structure according to any one of claims 1 to 3, wherein a depth of said through hole is larger than an inner diameter of said through hole.

6. A structure according to any one of claims 1 to 3, wherein an area ratio of said through holes to the multi-layer wiring layer is .not more than 10%.

7. A structure according to any one of claims 1 to 3, wherein said insulation layer has a dielectric constant of 2.2–4.7.

8. A packaging board according to claim 3, wherein said electronic device is a semiconductor device.

9. A packaging board according to claim 3, wherein said electronic device is a plastic-molded-type large-scale integrated circuit.

10. A packaging board according to claim 3, wherein said electronic device is a bare large-scale integrated circuit.

11. A packaging board according to claim 3, wherein said electronic device is mounted directly on the multi-layer wiring structure.

12. A packaging board according to claim 11, wherein said electronic device is a large-scale integrated circuit.

13. A multi-layer wiring structure comprising a complex of at least two sub-assemblies each having a wiring layer formed through an insulation layer on a surface of a core material of a metallic foil made of at least one metal selected from the group consisting of tungsten, molybdenum, an iron-nickel alloy, an iron-nickel-cobalt alloy, iron, nickel and cobalt, said sub-assemblies being connected to one another by conductors via through holes, said conductors being formed by filling the through holes by plating or addition of paste, such that the through holes are filled with said conductors, and the sub-assemblies being laminated together by adhesive films.

14. A packaging board comprising a board having not less than two layers of wiring formed therein; and a multi-layer wiring structure provided on one side or each side of said board, said multi-layer wiring structure being connected to said board by conductors via through holes, said multi-layer wiring structure comprising a complex of at least two sub-assemblies each having wiring layers formed through an insulation layer on both upper and lower surfaces of a core material of a metallic foil made of at least one metal selected from the group consisting of tungsten, molybdenum, an iron-nickel alloy, an iron-nickel-cobalt alloy, iron, nickel and cobalt, said sub-assemblies being connected together by conductors via through holes, said conductors being formed by filling the through holes by plating or addition of paste, such that the through holes are filled with said conductors, and said sub-assemblies being laminated together by adhesive films.

15. An electronic device packaging board comprising a board having not less than two layers of wiring formed therein; and a multi-layer wiring structure provided on one side or each side of said board, said multi-layer wiring structure being connected to said board by conductors via through holes, said multi-layer wiring structure comprising a complex of at least two sub-assemblies each having wiring layers formed through an insulation layer on both upper and lower surfaces of a core material of a metallic foil made of at least one metal selected from the group consisting of tungsten, molybdenum, an iron-nickel alloy, an iron-nickel-cobalt alloy, iron, nickel and cobalt, said sub-assemblies being connected to one another by conductors via through holes, said conductors being formed by filling the through holes by plating or addition of pastes such that the through holes are filled with said conductors, and said sub-assemblies being laminated together by adhesive films.

16. A structure according to any one of claims 1–3, 13, 14 and 15, wherein said core material has a thermal expansion coefficient in a range of $1\times10^{-5}/°C.$ to $1\times10^{-7}/°C.$

* * * * *